US010135162B1

(12) United States Patent
Hejase et al.

(10) Patent No.: US 10,135,162 B1
(45) Date of Patent: Nov. 20, 2018

(54) METHOD FOR FABRICATING A HYBRID LAND GRID ARRAY CONNECTOR

(71) Applicant: International Business Machines Corporation, Armonk, NY (US)

(72) Inventors: Jose A. Hejase, Austin, TX (US); Wiren D. Becker, Hyde Park, NY (US); Daniel Dreps, Georgetown, TX (US); Sungjun Chun, Austin, TX (US); Brian Beaman, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/842,962

(22) Filed: Dec. 15, 2017

Related U.S. Application Data

(63) Continuation of application No. 15/717,978, filed on Sep. 28, 2017.

(51) Int. Cl.
*H01R 9/00* (2006.01)
*H05K 3/00* (2006.01)
(Continued)

(52) U.S. Cl.
CPC ....... *H01R 12/7076* (2013.01); *H01R 12/716* (2013.01); *H01R 13/245* (2013.01);
(Continued)

(58) Field of Classification Search
CPC .. H01R 12/7076; H01R 12/71; H01R 12/585; H01R 43/18; H01R 13/245;
(Continued)

(56) References Cited

U.S. PATENT DOCUMENTS 4,838,800 A * 6/1989 Lynch .................. H01R 12/585
361/773
6,086,386 A 7/2000 Fjelstad et al.
(Continued)

FOREIGN PATENT DOCUMENTS

JP 2004200452 A 7/2004
JP 2007005087 A 1/2007

OTHER PUBLICATIONS

Hejase et al., "Hybrid Land Grid Array Connector for Improved Signal Integrity", U.S. Appl. No. 15/717,978, filed Sep. 28, 2017, 22 pages.
(Continued)

*Primary Examiner* — Donghai D Nguyen
(74) *Attorney, Agent, or Firm* — Edward J. Wixted, III; Brian M. Restauro

(57) ABSTRACT

Embodiments of the present invention include a method for fabricating a hybrid land grid array connector and the resulting structures. A body is provided. The body includes a first plurality of holes and a second plurality of holes. A conductive layer is deposited on the top and bottom surfaces of the body and the wall surfaces of the first plurality of holes resulting in the top and bottom surfaces being electrically common. The conductive layer is removed from the wall surfaces of a first subset of the first plurality of holes. A portion of the conductive layer is removed from the top surface of the body and the bottom surface of the body from an area surrounding the first subset of the first plurality of holes.

7 Claims, 5 Drawing Sheets

(51) Int. Cl.
*H01R 12/70* (2011.01)
*H01R 12/71* (2011.01)
*H01R 43/18* (2006.01)
*H01R 43/20* (2006.01)
*H01R 13/24* (2006.01)

(52) U.S. Cl.
CPC ............ *H01R 43/18* (2013.01); *H01R 43/205* (2013.01); *Y10T 29/49147* (2015.01)

(58) Field of Classification Search
CPC .... H01R 12/716; H01R 43/205; H05K 1/141; H05K 3/429; Y10T 29/49155; Y10T 29/49156; Y10T 29/49165; Y10T 29/49167; Y10T 29/49147
USPC ........... 29/842, 843, 846, 852, 853; 361/773
See application file for complete search history.

(56) References Cited

U.S. PATENT DOCUMENTS

| | | | |
|---|---|---|---|
| 6,122,172 A | 9/2000 | Dumoulin et al. | |
| 6,621,155 B1 | 9/2003 | Perino et al. | |
| 6,870,251 B2 | 3/2005 | Tran | |
| 6,913,468 B2 | 7/2005 | Dozier, II et al. | |
| 6,933,596 B2 | 8/2005 | Hathaway et al. | |
| 6,954,984 B2 * | 10/2005 | McAllister | H05K 1/141 |
| | | | 29/846 |
| 7,053,729 B2 | 5/2006 | Aguirre et al. | |
| 7,083,424 B2 | 8/2006 | Motohashi | |
| 7,337,537 B1 * | 3/2008 | Smetana, Jr. | H05K 3/429 |
| | | | 29/846 |
| 7,363,688 B2 | 4/2008 | McAllister et al. | |
| 7,695,288 B2 | 4/2010 | Ma et al. | |
| 7,841,859 B2 | 11/2010 | Liao et al. | |
| 8,157,591 B2 | 4/2012 | Fedder et al. | |
| 8,195,855 B2 | 6/2012 | Jeong et al. | |
| 8,851,904 B2 * | 10/2014 | Chang | H01R 12/71 |
| | | | 439/607.03 |
| 9,252,077 B2 | 2/2016 | Molzer et al. | |
| 2009/0047805 A1 | 2/2009 | Liao et al. | |
| 2010/0151741 A1 | 6/2010 | Fedder et al. | |
| 2012/0113615 A1 | 5/2012 | Nath et al. | |
| 2015/0170996 A1 | 6/2015 | Alltabella Lazzi et al. | |

OTHER PUBLICATIONS

IBM, "List of Patent Applications Treated as Related", Appendix P, Dated Dec. 14, 2017, 2 pages.

* cited by examiner

METHOD FOR FABRICATING A HYBRID LAND GRID ARRAY CONNECTOR

BACKGROUND

The present invention relates generally to the field of connectors, and more particularly to hybrid land grid array connectors for improved signal integrity properties.

A hybrid land grid array (HLGA) connector provides an interconnect between a chip carrier package (e.g., a central processing unit or CPU package) and a printed circuit board (PCB). The HLGA, which is soldered to the PCB by way of ball grid array (BGA) balls, includes spring contacts that mate to the chip carrier pads, which are plated with nickel and gold, and which provide an electrical connection between the chip carrier package and the PCB. The chip carrier package is placed into the HLGA and is held in place by a spring-loaded mechanism. Should the chip carrier package fail to function properly, the HLGA allows for a simple field replacement of the non-functioning chip carrier package without needing to replace the entire PCB.

SUMMARY OF THE INVENTION

Embodiments of the present invention include a method for fabricating a hybrid land grid array connector and the resulting structures. The method can include providing a body which includes a first plurality of holes and a second plurality of holes. The method can also include depositing a conductive layer on the top and bottom surfaces of the body and the wall surfaces of the first plurality of holes resulting in the top and bottom surfaces being electrically common. The method can also include removing the conductive layer from the wall surfaces of a first subset of the first plurality of holes. The method can also include removing a portion of the conductive layer from the top surface of the body and the bottom surface of the body from an area surrounding the first subset of the first plurality of holes.

DETAILED DESCRIPTION

Figure 1:
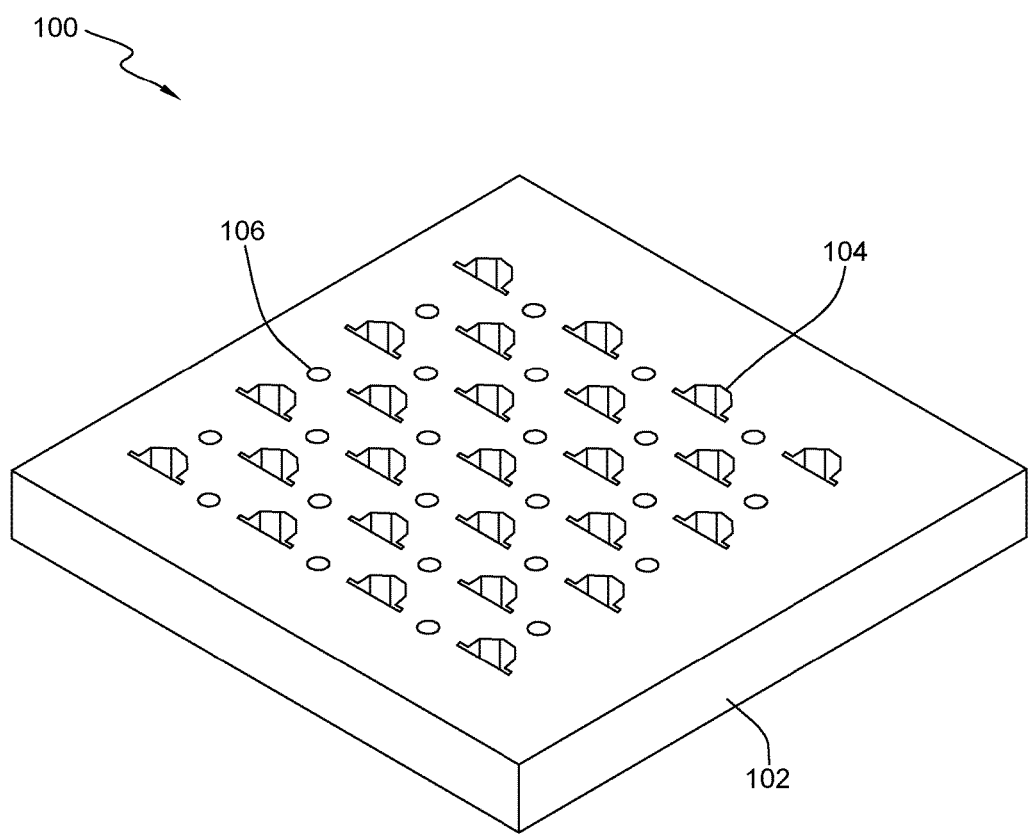
FIG. 1 depicts an example hybrid land grid array (HLGA) connector body populated with holes for plated vias and holes for spring contacts, in accordance with an embodiment of the present invention.

Embodiments of the present invention provide for a hybrid land grid array (HLGA) connector for improved signal integrity. In use, an HLGA connector is soldered to pads on a printed circuit board (PCB). The connection is made between ball grid array (BGA) balls on the HLGA and copper pads on the PCB. A chip carrier package (e.g., a central processing unit or CPU) is seated into the HLGA, firmly held in place by a spring-loaded clamping assembly. The HLGA connector includes metal spring contacts, mounted in a plastic body, which provide an electrical connection between the CPU and the PCB. For example, electrical signals travel from a first CPU, through a first HLGA, into the PCB, through a second HLGA, and to a second CPU. The electrical signals can get attenuated, gather noise and crosstalk, and encounter impedance mismatches. Current HLGA connectors can have data transfer rates of up to 25 Gbps (gigabits/second). Achieving higher data rates with existing HLGA connectors is challenging due to high impedance mismatch and crosstalk concerns.

Embodiments of the present invention recognize that there is an approach for designing an HLGA for better signaling integrity capable of achieving data transfer rates in excess of 25 Gbps. In an embodiment, plated vias or conductive posts are placed at half-pitch (interstitially) between the holes in the body of the plastic (i.e., dielectric material) connector body that accept the spring contacts. The plated vias/conductive posts are electrically connected to the ground contact springs. The network of grounded plated vias/conductive posts create capacitance in the HLGA connector which decreases the overall inductive mismatch in the connector. Additionally, a shorter and denser return path creates the correct environment to decrease electrical crosstalk noise and push any connector crosstalk resonances higher in frequency.

References in the specification to "one embodiment", "an embodiment", "an example embodiment", etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "right", "left", "vertical", "horizontal", "top", "bottom", and derivatives thereof shall relate to the disclosed structures and methods, as oriented in the drawing Figures. The terms "overlaying", "atop", "positioned on", or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

As referred to herein, certain elements referred to as singular can also be considered to be plural. In the following examples, the term "X" refers to both a single "X" and two or more of "X": "hole", "signal contact clearance area", "plated conductive via", "ground spring contact", signal spring contact", "conductive post", "inserted conductive post", and "plated conductive post".

The present invention will now be described in detail with reference to the Figures.

FIG. 1 is an example HLGA connector body, generally designated 100, in accordance with one embodiment of the present invention. FIG. 1 provides only an illustration of one implementation and does not imply any limitations with regard to the different embodiments that may be implemented. Many modifications to the depicted embodiment may be made by those skilled in the art without departing from the scope of the invention as recited by the claims.

In an embodiment, HLGA connector 100 includes connector body 102, holes for spring contacts 104, and holes for plated vias 106. In example embodiments, HLGA connector 100 may include other attributes (not shown in FIG. 1) such as identification markings, electrical circuitry, electrical components, etc. In an embodiment, HLGA connector 100 can be four-sided (e.g., a square or a rectangle) but is not limited to a particular shape and is only constrained from a shape and size perspective by the CPU/PCB combination.

According to embodiments of the present invention, connector body 102 is preferably composed of a solid dielectric material. Example dielectric materials include, but are not limited to, plastic, ceramic, glass, mica, and various metal oxides. Dielectric materials are electrically insulating, and therefore, poor conductors of electrical current. Dielectric materials also efficiently support electrostatic fields. In an embodiment, a dielectric material is used for connector body 102 so that good signal integrity is maintained for electrical signals guided by electrical contacts, such as metal spring contacts (e.g., see FIG. 3, ground spring contact 302 and signal spring contact 304), included in connector body 102.

In an embodiment, holes for spring contacts 104 are holes in connector body 102 which begin at the top surface of connector body 102 and end at the bottom surface of connector body 102 going completely through connector body 102. In the embodiment, the bottom surface of connector body 102 is opposite the top surface of connector body 102. According to an embodiment, holes for spring contacts 104 can be used to allow placement of metal spring contacts into connector body 102. In an embodiment, holes for spring contacts 104 are positioned in a repetitive grid pattern within connector body 102. According to an embodiment of the present invention, holes for spring contacts 104 are shaped in a manner which securely holds the spring contacts in connector body 102 so that the spring contacts do not become loose as HLGA connector 100 is used. In an embodiment, holes for spring contacts 104 remain empty after the placement of the metal spring contacts. In another embodiment, holes for spring contacts 104 used for ground spring contact 302 are filled with a dielectric material, prior to any plating of a conductive material (discussed below), after the placement of all of the ground spring contacts 302. In the embodiment, the additional dielectric material in the holes for spring contacts 104 provides for improved electrical performance of the HLGA connector.

In an embodiment, holes for plated vias 106 are holes in connector body 102 which begin at the top surface of connector body 102 and end at the bottom surface of connector body 102 going completely through connector body 102. According to an embodiment, holes for plated vias 106 can be plated with a conductive material providing an electrical connection between a conductive plating on the top surface of connector body 102 and a conductive plating on the bottom surface of connector body 102. In an embodiment, holes for plated vias 106 are positioned at the midpoints (i.e., at half-pitch) between the holes for spring contacts 104 in connector body 102. In an embodiment, holes for plated vias 106 are substantially smaller in size relative to holes for spring contacts 104.

Figure 2:
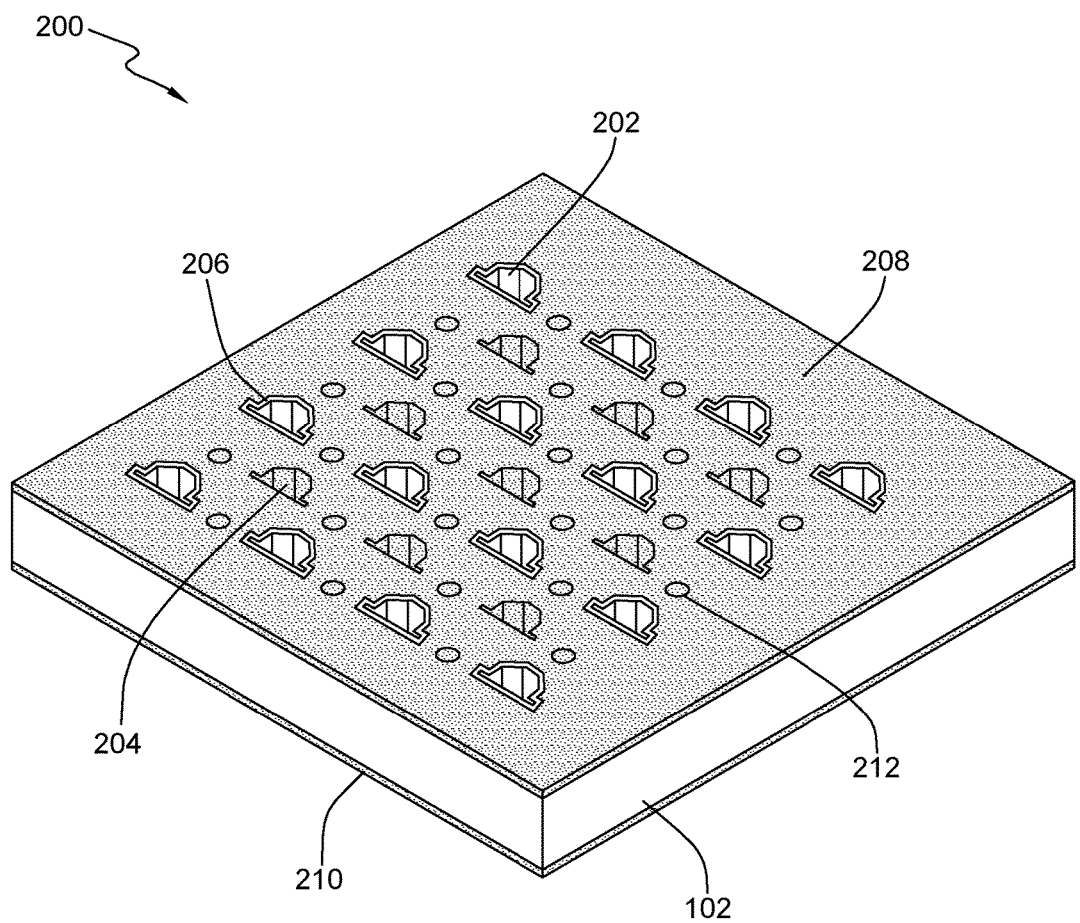
FIG. 2 depicts the HLGA connector body of FIG. 1 after plating and etching fabrication steps, in accordance with an embodiment of the present invention.

FIG. 2 depicts the HLGA connector of FIG. 1 after plating and etching fabrication steps, and is generally designated 200 in accordance with one embodiment of the present invention. FIG. 2 provides only an illustration of one implementation and does not imply any limitations with regard to the different embodiments that may be implemented. Many modifications to the depicted embodiment may be made by those skilled in the art without departing from the scope of the invention as recited by the claims.

In an embodiment, HLGA connector 200 includes the previously discussed feature connector body 102, and new features holes for signal contacts 202, holes for ground contacts 204, signal contact clearance area 206, top conductive layer 208, bottom conductive layer 210, and plated conductive via 212.

According to an embodiment of the present invention, holes for signal contacts 202 and holes for ground contacts 204 are holes for spring contacts 104 which have been identified as either a signal connection or a ground connection between the chip carrier package (e.g., central processing unit or CPU) and the printed circuit board (PCB). In an embodiment, the other features of holes for spring contacts 104 that have been previously discussed apply to holes for signal contacts 202 and holes for ground contacts 204. In an embodiment, hole for ground contact 204 is ultimately plated with a conductive metal such as copper and when the spring contact is placed into hole for ground contact 204, electrical contact between the spring contact and the surface plated metal is required. In this embodiment, hole for ground contact 204 is not filled with any other material other than air. In the previously discussed embodiment with a dielectric material filling hole for ground contact 204 after placement of the spring contacts, a surface plating over the dielectric material in hole for ground contact 204 (e.g., plating with a conductive metal such as copper) provides an electrical connection between the ground spring contacts (such as ground spring contact 302 in FIG. 3), top conductive layer 208 (discussed below), and bottom conductive later 210 (discussed below) by virtue of being in physical contact with the ground spring contacts, top conductive layer 208, and bottom conductive later 210.

In an embodiment, top conductive layer 208 and bottom conductive layer 210 are the top surface and bottom surface, respectively, of connector body 102 following application of a conductive layer. According to an embodiment of the present invention, the conductive layer applied to top conductive layer 208 and to bottom conductive layer 210 is copper applied with a plating process. In the embodiment, the applied conductive layer applied to the top surface of connector body 102 is in direct contact with the top surface of connector body 102. Also in the embodiment, the applied conductive layer applied to the bottom surface of connector body 102 is in direct contact with the bottom surface of connector body 102. According to other embodiments, the conductive layer applied to top conductive layer 208 and to bottom conductive layer 210 is any sufficiently conductive material known in the art applied by any process known in the art. In an embodiment, following the application of the conductive layer, top conductive layer 208 is completely covered with the conductive material and is electrically common. Also in the embodiment, following the application of the conductive layer, bottom conductive layer 210 is also completely covered with the conductive material and is also electrically common. In the embodiment, the wall surfaces for hole for signal contact 202, the wall surfaces for hole for ground contact 204, and the wall surfaces for plated conductive via 212 are plated and electrically common with top conductive layer 208 and bottom conductive layer 210, until signal contact clearance area 206 (discussed below) is created.

According to an embodiment of the present invention, signal contact clearance area 206 is an area around holes for signal contact 202 that has the conductive layer removed. In an embodiment, a portion of top conductive layer 208 is removed from the top surface of connector body 102 around each of the holes for signal contacts 202. In the embodiment, a portion of bottom layer 210 is also removed from the bottom surface of connector body 102 around each of the holes for signal contacts 202. Also in the embodiment, the plating on the wall surfaces of hole for signal contact 202 is removed. According to an embodiment of the present invention, a subtractive photolithography process is used to remove the portion of top conductive layer 208 and the portion of bottom conductive layer 210. For example, with respect to top conductive layer 208, a photoresist is applied over top conductive layer 208. An expose pattern is developed in the photoresist defining each signal contact clearance area 206. Connector body 102 is baked to stabilize the remaining photoresist. An etch process is then used to remove the portion of top conductive layer 208 around each of the holes for signal contact 202 resulting in the formation of the signal contact clearance area 206. A photoresist strip process removes the balance of the photoresist from top conductive layer 208. Connector body 102 is then processed through a cleaning process to remove any residual process materials. In an embodiment, the same process is used to define each of the signal contact clearance area 206 in bottom conductive layer 210. The results of the above photolithography processes are removing the plating from the wall surfaces of hole for signal contact 202, the creation of signal contact clearance area 206 (for electrically isolating signal spring contact 304 in FIG. 3), and leaving the plating on the wall surfaces of hole for ground contact 204 intact. According to other embodiments of the present invention, any process known in the art can be used to define each of the signal contact clearance area 206 in both the top conductive layer 208 and the bottom conductive layer 210.

In an embodiment, plated conductive via 212 is a hole for a plated via 106 that has been plated with a conductive material. According to an embodiment of the present invention, the conductive material applied to plated conductive via 212 is copper applied using an electrolytic plating process. According to other embodiments, the conductive material applied to plated conductive via 212 is any sufficiently conductive material known in the art applied by any process known in the art. In an embodiment, following the application of the conductive material to holes for plated vias 106, plated conductive via 212 is electrically connected to both top conductive layer 208 and bottom conductive layer 210.

Figure 3:
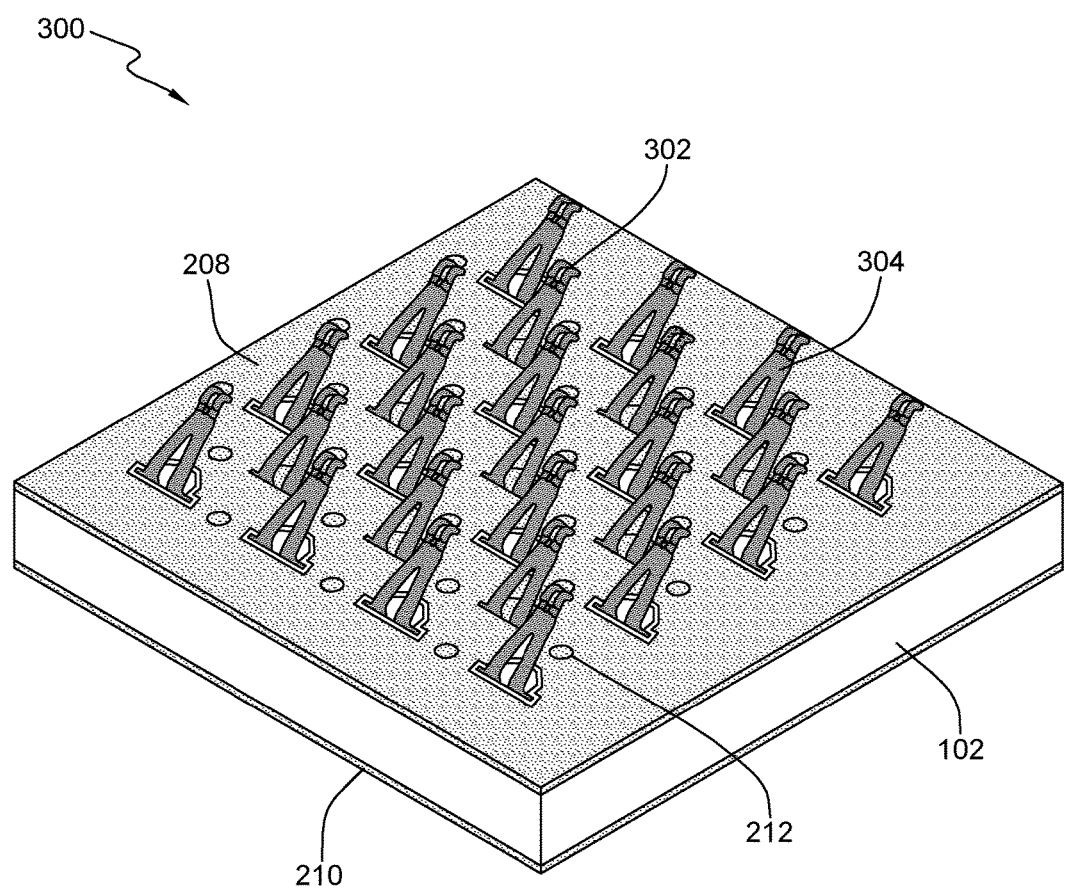
FIG. 3 depicts the HLGA connector body of FIG. 2 after the installation of the signal spring contacts and ground spring contacts, in accordance with an embodiment of the present invention.

FIG. 3 depicts the HLGA connector of FIG. 2 after the installation of metal spring contacts, and is generally designated 300 in accordance with one embodiment of the present invention. FIG. 3 provides only an illustration of one implementation and does not imply any limitations with regard to the different embodiments that may be implemented. Many modifications to the depicted embodiment may be made by those skilled in the art without departing from the scope of the invention as recited by the claims.

In an embodiment, HLGA connector 300 includes the previously discussed features connector body 102, top conductive layer 208, bottom conductive layer 210, and plated conductive via 212, and new features ground spring contact 302 and signal spring contact 304.

In an embodiment, ground spring contact 302 is a pre-formed, metal spring contact that is inserted (i.e., stitched) into holes for ground contacts 204 in connector body 102. Ground spring contact 302 will contact both the ground land grid array (LGA) pads on the CPU and solder to the ground pads on the PCB providing an interconnection between the CPU and the PCB. According to an embodiment of the present invention, ground spring contact 302 is pre-formed from copper. According to other embodiments of the present invention, ground spring contact 302 is pre-formed from any other sufficiently conductive metal known in the art. In an embodiment, ground spring contact 302 is stitched into holes for spring contacts 204 and is mechanically held in place. In an embodiment, ground spring contact 302 has an electrical connection to top conductive layer 208, bottom conductive layer 210, and plated conductive via 212 due to ground spring contact 302 physically in contact with top conductive layer 208, bottom conductive layer 210, and the conductive plating inside hole for ground contact 204.

In an embodiment, signal spring contact 304 is a pre-formed, metal spring contact that is inserted (i.e., stitched) into holes for signal contacts 202 in connector body 102. Signal spring contact 304 will contact both signal land grid array (LGA) pads on the CPU and solder to the signal pads on the PCB providing an interconnection between the CPU and the PCB. According to an embodiment of the present invention, signal spring contact 304 is pre-formed from copper. According to other embodiments of the present invention, signal spring contact 304 is pre-formed from any other conductive metal known in the art. In an embodiment, signal spring contact 304 is stitched into holes for signal contacts 202 and is mechanically held in place. In an embodiment, signal spring contact 304 is not electrically connected any of top conductive layer 208, bottom conductive layer 210, and plated conductive via 212.

Figure 4:
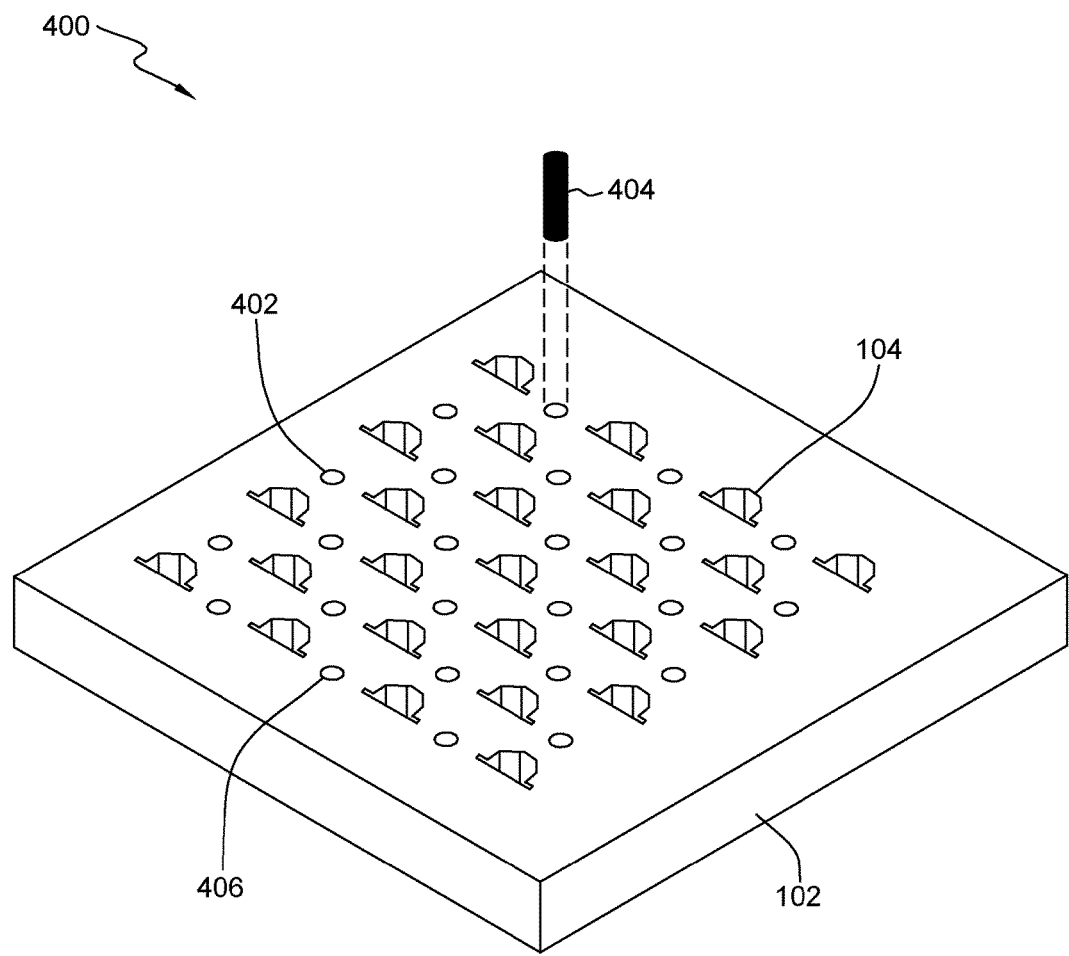
FIG. 4 depicts an example HLGA connector body populated with holes for conductive posts and holes for spring contacts, in accordance with an embodiment of the present invention.

FIG. 4 is an example HLGA connector body, generally designated 400, in accordance with one embodiment of the present invention. FIG. 4 provides only an illustration of one implementation and does not imply any limitations with regard to the different embodiments that may be implemented. Many modifications to the depicted embodiment may be made by those skilled in the art without departing from the scope of the invention as recited by the claims.

In an embodiment, HLGA connector 400 includes the previously discussed features connector body 102 and holes for spring contacts 104, and new features holes for conductive posts 402 and conductive post 404.

In an embodiment, holes for conductive posts 402 are substantially similar to holes for plated vias 106. According to an embodiment of the present invention, holes for conductive posts 402 are holes in connector body 102 which begin at the top surface of connector body 102 and end at the bottom surface of connector body 102 going completely through connector body 102. In an embodiment, holes for conductive posts 402 are positioned at the mid-points between the holes for spring contacts 104 in connector body 102. In an embodiment, holes for conductive posts 402 are substantially smaller in size than holes for spring contacts 104.

In an embodiment, conductive post 404 is a solid post (e.g., a pin) that is stitched into holes for conductive posts 402 and is mechanically held in place. According to an embodiment, conductive post 404 is made from copper. According to another embodiment, conductive post 404 is made from any conductive metal known in the art.

In an embodiment, inserted conductive post 406 is conductive post 404 inserted into connector body 102. In an embodiment, the top and bottom of inserted conductive post 406 are on the same plane as the top surface and bottom surface of connector body 102, respectively. In another embodiment, the top and bottom of inserted conductive post 406 extend beyond the plane of the top surface and the plane of the bottom surface of connector body 102, respectively, to a maximum height above each plane.

Figure 5:
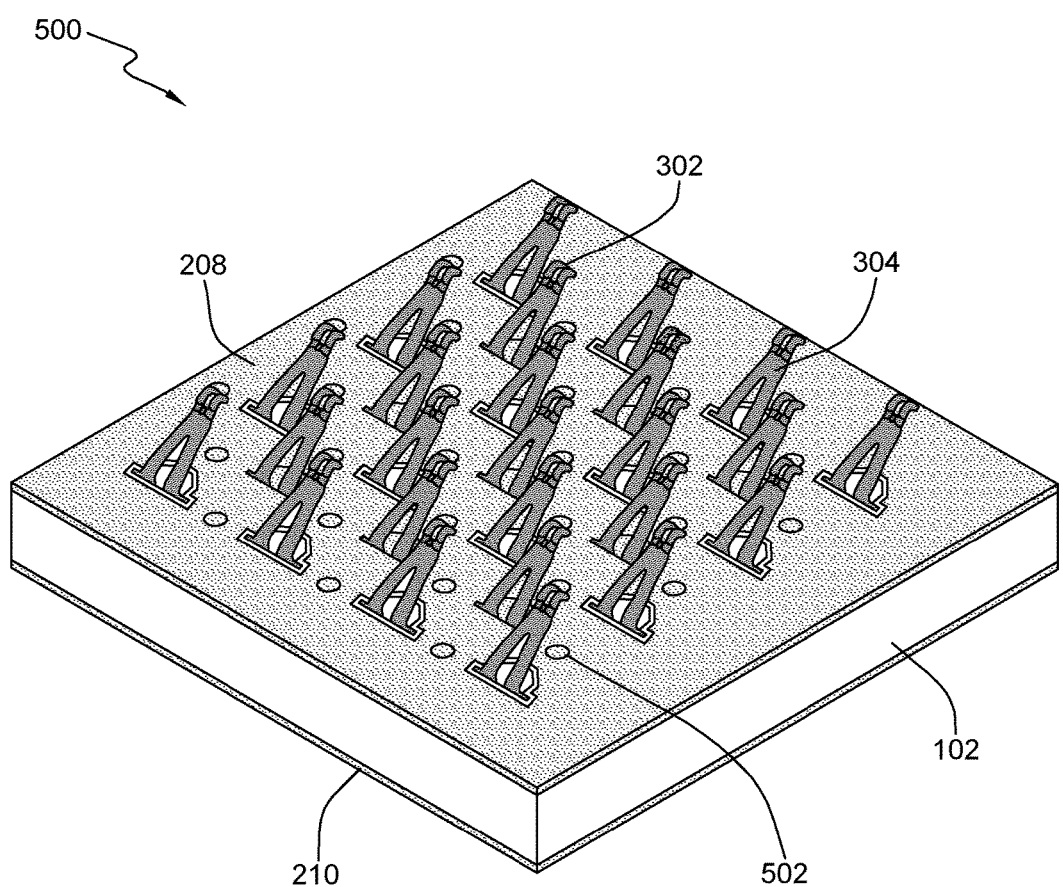
FIG. 5 depicts the HLGA connector body of FIG. 4 after the installation of the plating, conductive posts, the signal spring contacts, and the ground spring contacts, in accordance with an embodiment of the present invention.

FIG. 5 is the HLGA connector of FIG. 4 after plating and etching fabrication steps, and is generally designated 500 in accordance with one embodiment of the present invention. FIG. 5 provides only an illustration of one implementation and does not imply any limitations with regard to the different embodiments that may be implemented. Many modifications to the depicted embodiment may be made by those skilled in the art without departing from the scope of the invention as recited by the claims.

In an embodiment, HLGA connector 500 includes the previously discussed features connector body 102, top conductive layer 208, bottom conductive layer 210, ground spring contact 302, and signal spring contact 304, and new feature plated conductive post 502.

In an embodiment, plated conductive post 502 is inserted conductive post 406 that has been through the previously described photolithography process resulting in top conductive layer 208, bottom conductive layer 210, signal contact clearance area 206 (not shown in FIG. 5), plating on the top of inserted conductive post 406, plating on the bottom of inserted conductive post 406, and an electrical connection of the plating to ground spring contact 302. According to an embodiment of the present invention, the plating on the top and the bottom of plated conductive post 502 is copper plating. According to other embodiments of the present invention, the plating on the top and the bottom of plated conductive post 502 is any conductive plating known in the art.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of an HLGA for improved signal integrity and a process of manufacturing an HLGA for improved signal integrity (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method, the method comprising:
providing a body for a hybrid land grid array connector, wherein the body includes a first plurality of holes and a second plurality of holes;
depositing a conductive layer on a top surface of the body, a bottom surface of the body, and wall surfaces of the first plurality of holes, wherein the top surface of the body is electrically common with the bottom surface of the body;
removing the conductive layer from wall surfaces of a first subset of the first plurality of holes; and
removing a portion of the conductive layer on the top surface of the body and the bottom surface of the body from an area surrounding the first subset of the first plurality of holes.

2. The method of claim 1, further comprising:
stitching a plurality of spring contacts into the first plurality of holes, wherein:
the plurality of spring contacts stitched into the first subset of the first plurality of holes are electrically isolated from one another; and
the plurality of spring contacts stitched into a second subset of the first plurality of holes are electrically common with, at least, one another, the conductive layer on the top surface of the body, and the conductive layer on the bottom surface of the body.

3. The method of claim 1, wherein a subtractive photolithography process is used to remove the conductive layer from the wall surfaces of the first subset of the first plurality of holes and the area surrounding the first subset of the first plurality of holes.

4. The method of claim 1, further comprising:
depositing a material into a second subset of the first plurality of holes.

5. The method of claim 4, wherein the material is a dielectric material.

6. The method of claim 1, wherein the step of depositing a conductive layer on a top surface of the body, a bottom surface of the body, and wall surfaces of the first plurality of holes further comprises:
depositing the conductive layer on wall surfaces of the second plurality of holes.

7. The method of claim 1, further comprising:
stitching a conductive post into each of the second plurality of holes, wherein the conductive post provides an electrical connection between the conductive layer on the top surface of the body and the conductive layer on the bottom surface of the body.

* * * * *